United States Patent
Lee

(10) Patent No.: US 9,330,780 B1
(45) Date of Patent: May 3, 2016

(54) SEMICONDUCTOR DEVICE INCLUDING A MEMORY BLOCK AND METHOD OF OPERATING THE SAME

(71) Applicant: SK hynix Inc., Icheon-si Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/708,904

(22) Filed: May 11, 2015

(30) Foreign Application Priority Data

Dec. 8, 2014 (KR) .......................... 10-2014-0175211

(51) Int. Cl.
*G11C 16/34* (2006.01)
*G11C 16/10* (2006.01)
*G11C 11/56* (2006.01)

(52) U.S. Cl.
CPC ............ *G11C 16/3459* (2013.01); *G11C 16/10* (2013.01); *G11C 11/5628* (2013.01); *G11C 16/3454* (2013.01)

(58) Field of Classification Search
CPC ........... G11C 16/3454; G11C 16/3459; G11C 11/5628
USPC ............. 365/185.22, 185.14, 185.28, 185.17, 365/185.33
See application file for complete search history.

(56) References Cited

U.S. PATENT DOCUMENTS

2013/0223155 A1* 8/2013 Oowada ............. G11C 11/5642
365/185.22

FOREIGN PATENT DOCUMENTS

KR 1020120005831 A 1/2012
KR 1020130045730 A 5/2013

* cited by examiner

*Primary Examiner* — Jason Lappas
(74) *Attorney, Agent, or Firm* — William Park & Associates Ltd.

(57) ABSTRACT

A semiconductor device and method of operating the same are provided. The semiconductor device may include a memory block including drain select transistors connected to bit lines, source select transistors connected to a common source line, and memory cells connected between the drain select transistors and the source select transistors. The semiconductor device may include an operation circuit configured to repeatedly perform a program operation and a program verifying operation to increase threshold voltages of the drain select transistors to a target level. The operation circuit may be configured to apply a level lower than a verifying voltage initially applied to the drain select transistors for the program verifying operation. The level being lower than a normal level. The operation circuit may be configured to increase the verifying voltage to the normal level whenever the program verifying operation is repeated.

20 Claims, 11 Drawing Sheets

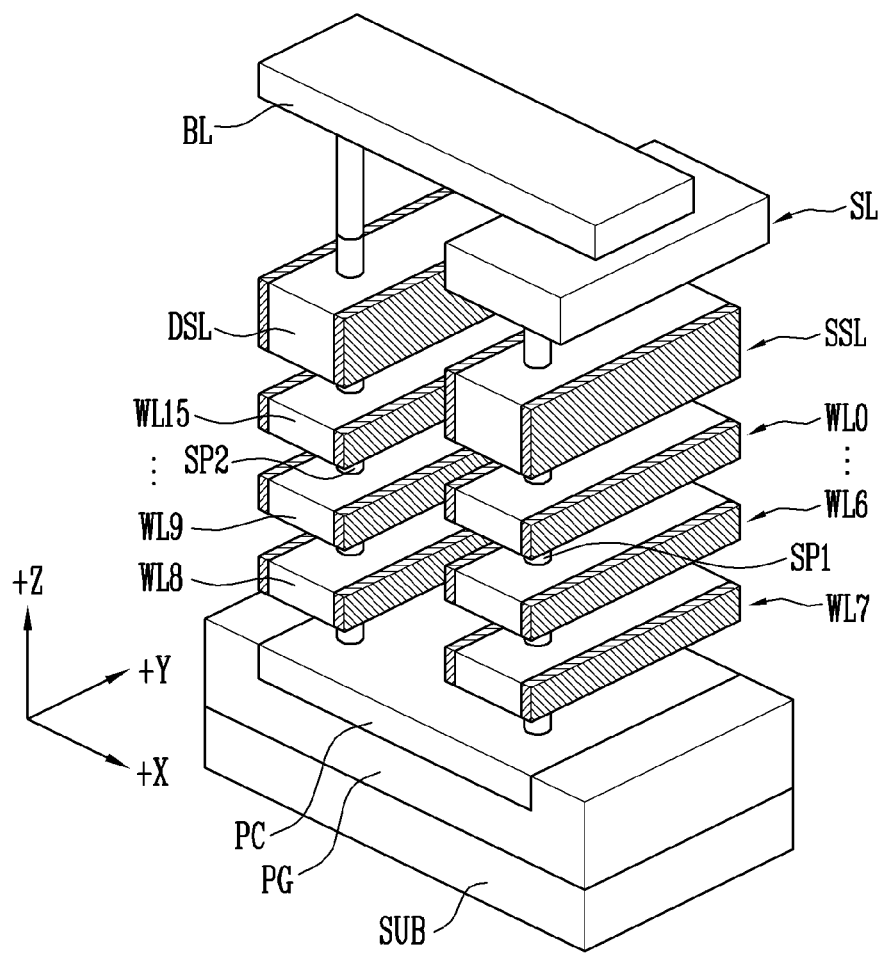

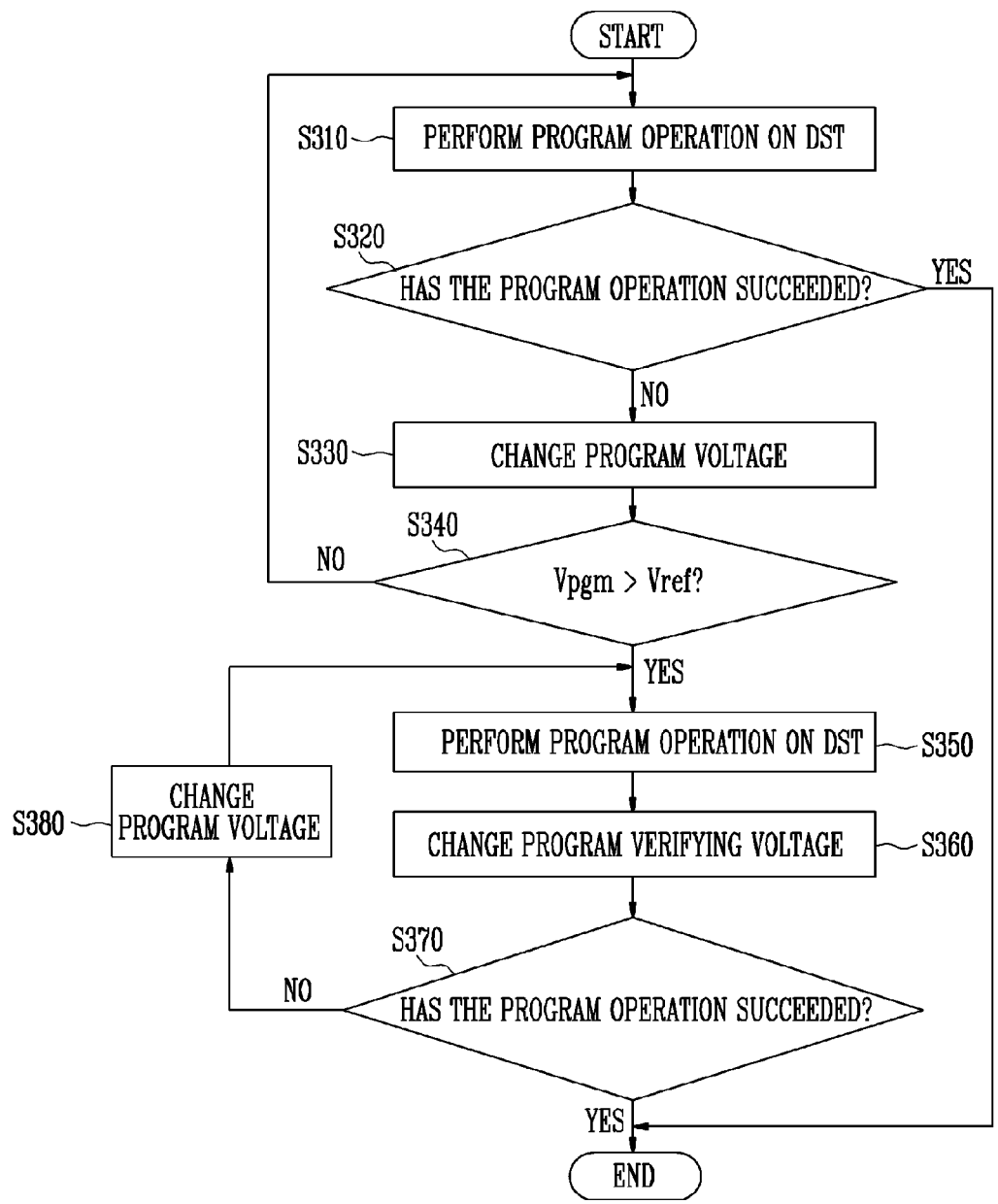

SEMICONDUCTOR DEVICE INCLUDING A MEMORY BLOCK AND METHOD OF OPERATING THE SAME

CROSS-REFERENCE TO RELATED APPLICATION

The present application claims priority to Korean patent application number 10-2014-0175211 filed on Dec. 8, 2014, in the Korean Intellectual Property Office, the entire disclosure of which is incorporated by reference herein.

BACKGROUND

1. Technical Field

Various embodiments generally relate to a semiconductor device. More particularly, the embodiments relate to a semiconductor device including a memory block and method of operating the same.

2. Related Art

A memory block of a NAND flash memory device includes a drain select transistor, memory cells, and a source select transistor. The drain select transistor, memory cells, and a source select transistor are connected between a bit line and a common source line. The select transistors may be formed to have the same structure as the memory cells. Accordingly, the select transistors should have a predetermined threshold voltage in order to operate like a conventional transistor. The threshold voltages of the select transistors may be controlled by a program operation. However, when the program operation is repeatedly performed on the select transistors in which the threshold voltages are lower than a target level, the threshold voltages of the select transistors in which the threshold voltages reach the target voltage in advance are further increased. Accordingly, since threshold voltage distribution of the select transistors is wide, an operation error may occur.

BRIEF SUMMARY

In an embodiment, a semiconductor device may include a memory block including drain select transistors connected to bit lines, source select transistors connected to a common source line, and memory cells connected between the drain select transistors and the source select transistors. The semiconductor device may include an operation circuit configured to repeatedly perform a program operation and a program verifying operation to increase threshold voltages of the drain select transistors to a target level. The operation circuit may be configured to apply a level lower than a verifying voltage initially applied to the drain select transistors for the program verifying operation. The level being lower than a normal level. The operation circuit may be configured to increase the verifying voltage to the normal level whenever the program verifying operation is repeated.

In an embodiment, a method of operation of a semiconductor device, including an operation circuit and a memory block, the memory block including drain select transistors connected to bit lines, source select transistors connected to a common source line, and memory cells connected between the drain select transistors and the source select transistors device, may include repeatedly performing a program operation and a program verifying operation to increase threshold voltages of the drain select transistors to a target level. The method of operation of the semiconductor device may include applying a level lower than a verifying voltage initially applied to the drain select transistors for the program verifying operation, the level being lower than a normal level. The method of operation of the semiconductor device may include increasing the verifying voltage to the normal level whenever the program verifying operation is repeated.

BRIEF DESCRIPTION OF THE DRAWINGS

FIGS. 2A to 2E are representations of examples of diagrams for describing a memory block according to an embodiment.

FIG. 3 is a representation of an example of a flowchart for describing an operation of a semiconductor device according to an embodiment.

DETAILED DESCRIPTION

Various examples of embodiments will be described hereinafter with reference to the accompanying drawings. The embodiments, however, be embodied in different forms and should not be construed as limited to the embodiments set forth herein.

Various embodiments may be directed to a semiconductor device capable of improving reliability of an operation.

Figure 1:
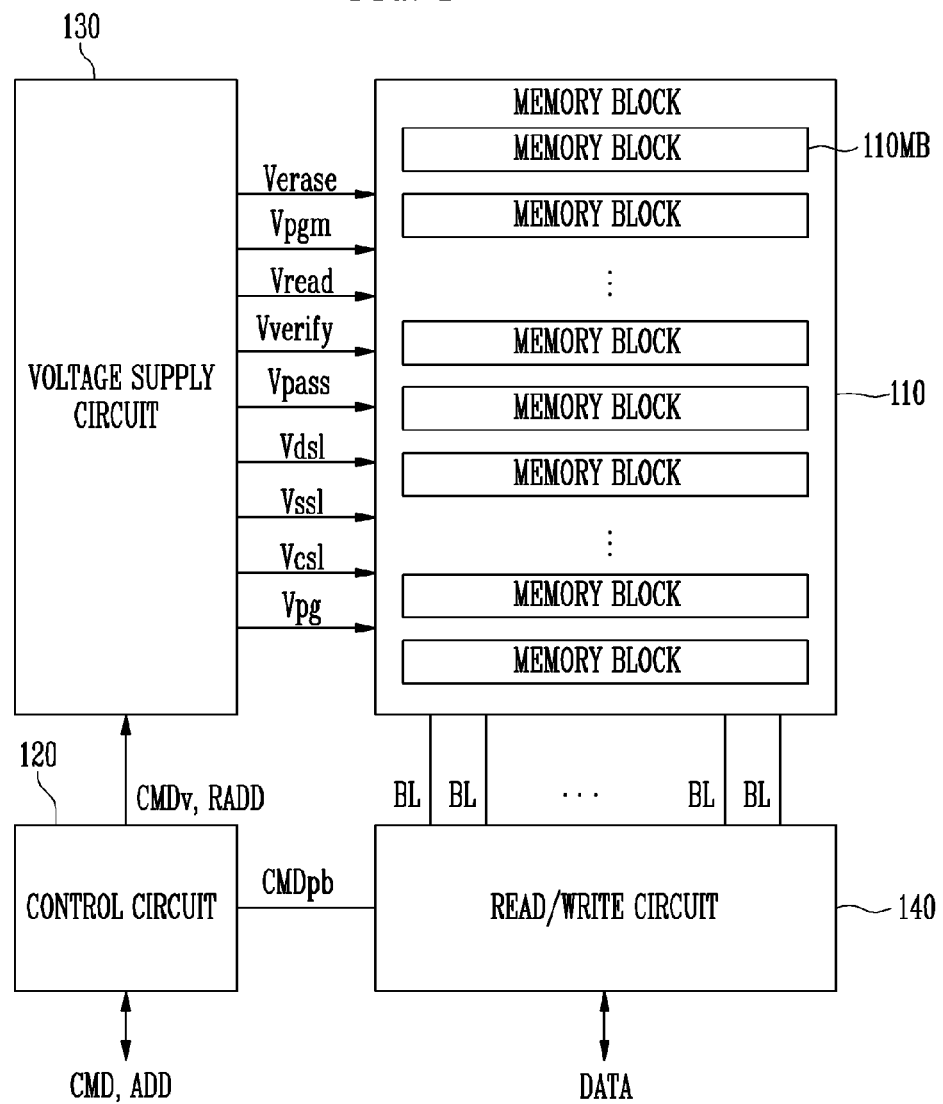
FIG. 1 is a block diagram illustrating a representation of an example of a semiconductor device according to an embodiment.

FIG. 1 is a block diagram illustrating a representation of an example of a semiconductor device according to an embodiment.

Referring to FIG. 1, the semiconductor device may include a memory array 110, and an operation circuit 120 to 140. The memory array 110 may include a plurality of memory blocks 110MB. Each of the memory blocks may include a plurality of memory strings. Each of the memory strings may include a plurality of memory cells. When the semiconductor device is a flash memory device, the memory block may include a flash memory cell. The memory cell may include a floating gate formed of polysilicon, or a charge storage film formed of a nitride film.

A memory block having a three-dimensional structure may include memory strings having a U-shape. The U-shaped memory strings may be connected to bit lines, respectively, and may be connected in parallel to a common source line. A structure of the memory block will be described below.

FIGS. 2A to 2E are representations of examples of diagrams for describing a memory block according to an embodiment.

Figure 2A:
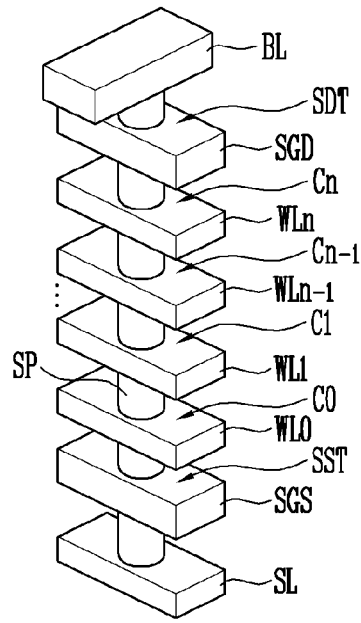
Figure 2B:
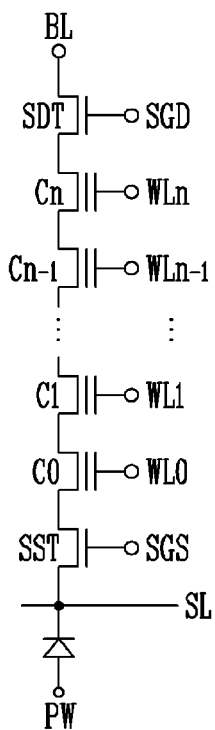

Referring to FIGS. 2A and 2B, the common source line SL may be formed on a semiconductor substrate SUB (i.e., see FIG. 2C) in which a P-well PW is formed. A vertical channel layer SP may be formed on the common source line SL. An upper portion of the vertical channel layer SP may be connected to the bit line BL. The vertical channel layer SP may be formed of polysilicon. A plurality of conductive films SGS, WL0 to WLn, and SGD may be formed to surround the vertical channel layer SP at different heights of the vertical channel layer SP. A multilayer film (not illustrated) including the charge storage film may be formed on a surface of the vertical channel layer SP. The multilayer film may be located between the vertical channel layer SP and the conductive films SGS, WL0 to WLn, and SGD.

The lowermost conductive film may be a source select line (or a first select line) SGS. The uppermost conductive film may be a drain select line (or a second select line) SGD. The conductive films between the select lines SGS and SGD may be word lines WL0 to WLn. The conductive films SGS, WL0 to WLn, and SGD may be formed as multiple layers on the semiconductor substrate. The vertical channel layer SP penetrating the conductive films SGS, WL0 to WLn, and SGD may be vertically connected between the bit line BL and the common source line SL formed on the semiconductor substrate.

A drain select transistor (or a second select transistor) SDT may be formed at a portion where the uppermost conductive film SGD surrounds the vertical channel layer SP. A source select transistor (or a first select transistor) SST may be formed at a portion where the lowermost conductive film SGS surrounds the vertical channel layer SP. Memory cells C0 to Cn may be formed at a portion where the intermediate conductive films WL0 to WLn surround the vertical channel layer SP.

For example, the memory string may include the source select transistor SST, the memory cells C0 to Cn, and the drain select transistor SDT connected between the common source line SL and the bit line BL and may be formed in a vertical direction with relation to the substrate. The source select transistor SST may electrically connect the memory cells C0 to Cn and the common source line SL according to a first selection signal applied to the first select line SGS. The drain select transistor SDT may electrically connect the memory cells C0 to Cn and the bit line BL according to a second selection signal applied to the second select line SGD.

Figure 2D:
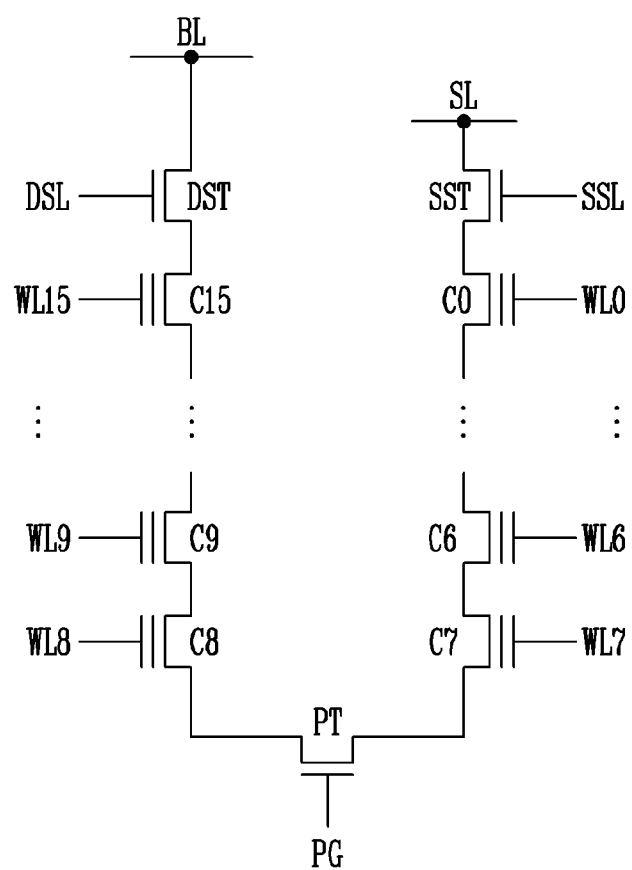

Referring to FIGS. 2C and 2D, a pipe gate PG including a recess portion may be formed on a semiconductor substrate SUB. A pipe channel layer PC may be formed in the recess portion of the pipe gate PG. A plurality of vertical channel layers SP1 and SP2 may be formed on the pipe channel layer PC. An upper portion of the first vertical channel layer SP1 of a pair of vertical channel layers may be connected to the common source line SL. An upper portion of the second vertical channel layer SP2 may be connected to the bit line BL. The vertical channel layers SP1 and SP2 may be formed of polysilicon.

A plurality of conductive films DSL and WL15 to WL8 may be formed to surround the second vertical channel layer SP2 at different positions of the second vertical channel layer SP2. A plurality of conductive films SSL and WL0 to WL7 may be formed to surround the first vertical channel layer SP1 at different positions of the first vertical channel layer SP1. A multilayer film (not illustrated) including a charge storage film may be formed on surfaces of the vertical channel layers SP1 and SP2 and a surface of the pipe channel layer PC. The multilayer film may be located between the vertical channel layers SP1 and SP2 and the conductive films DSL, WL15 to WL8, SSL, and WL0 to WL7 and between the pipe channel layer PC and the pipe gate PG.

The uppermost conductive film surrounding the second vertical channel layer SP2 may be the drain select line DSL. The lower conductive films below the drain select line DSL may be the word lines WL15 to WL8. The uppermost conductive film surrounding the first vertical channel layer SP1 may be the source select line SSL. The lower conductive films below the source select line SSL may be the word lines WL0 to WL7. A portion among the conducive films used as the word lines may include a dummy word line (not illustrated).

For example, the first conductive films SSL and WL0 to WL7 and the second conductive films DSL and WL15 to WL8 may be stacked on different areas of the semiconductor substrate, respectively. The first vertical channel layer SP1 penetrating the first conductive films SSL and WL1 to WL7 may be vertically connected between the source line SL and the pipe channel layer PC. The second vertical channel layer SP2 penetrating the second conductive films DSL and WL15 to WL8 may be vertically connected between the bit line BL and the pipe channel layer PC.

The drain select transistor DST may be formed at a portion in which the drain select line DSL surrounds the second vertical channel layer SP2. The main cell transistors C15 to C8 may be formed at portions where the word lines WL15 to WL8 surround the second vertical channel layer SP2. The source select transistor SST may be formed at a portion where the source select line SSL surrounds the first vertical channel layer SP1. The main cell transistors C0 to C7 may be formed at portions in which the word lines WL0 to WL7 surround the first vertical channel layer SP1.

In an embodiment, the memory string may include the drain select transistor DST and the main cell transistors C15 to C8 connected in a vertical direction to the substrate SUB between the bit line BL and the pipe channel layer PC, and the source select transistor SST and the main cell transistors C0 to C7 connected in a vertical direction to the substrate SUB between the common source line SL and the pipe channel layer PC. One dummy cell transistor (not illustrated) may be further connected between the select transistor DST or SST and the main cell transistor C15 or C0, and another dummy cell transistor (not illustrated) may be further connected between the main cell transistor C8 or C7 and a pipe transistor PT.

The source select transistor SST and the main cell transistors C0 to C7 connected between the common source line SL and the pipe transistor PT may configure a first vertical memory string. The drain select transistor DST and the main cell transistors C15 to C8 connected between the bit line BL and the pipe transistor PT may configure a second vertical memory string.

Figure 2E:
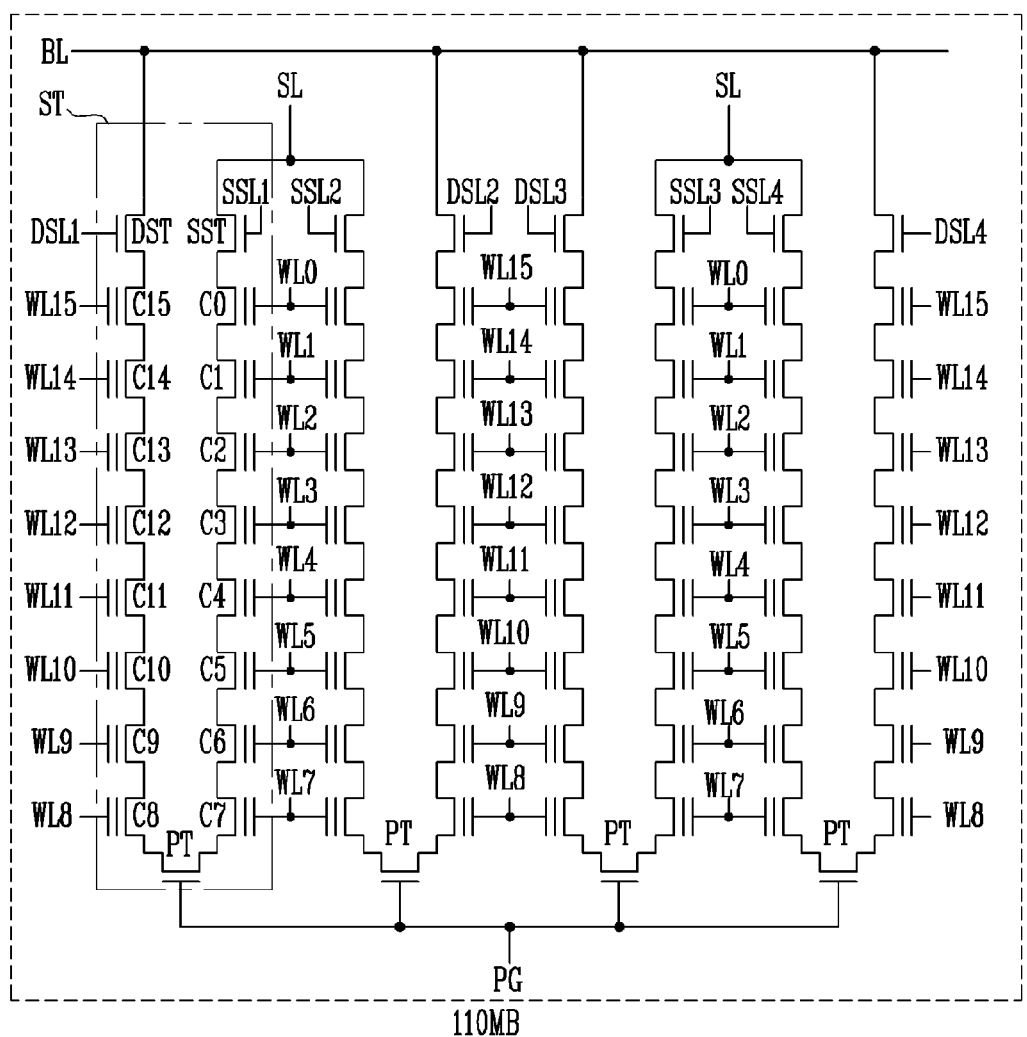

Referring to FIG. 2E, the memory block 110MB may include a plurality of memory strings ST connected to the bit lines. The memory string ST having the U-shape may include a first vertical memory string SST and C0 to C7 vertically connected between the common source line SL and the pipe transistor PT of the substrate, and a second vertical memory string C8 to C15 and DST vertically connected between the bit line BL and the pipe transistor PT of the substrate. The first vertical memory string SST and C0 to C7 may include the source select transistor SST and the memory cells C0 to C7 (i.e., main cell transistors). The source select transistor SST may be controlled by a voltage applied to the source select lines SSL1 to SSL4, and the memory cells C0 to C7 may be controlled by a voltage applied to the stacked word lines WL0 to WL7. The second vertical memory string C8 to C15 and DST may include the drain select transistor DST and the memory cells C8 to C15 (i.e., main cell transistors). The drain select transistor DST may be controlled by a voltage applied to the drain select lines DSL1 to DSL4. The memory cells C8 to C15 may be controlled by a voltage applied to the stacked word lines WL8 to WL15.

The pipe transistor PT connected between a pair of memory cells C7 and C8 located in the middle of the memory string having the U-shape may perform an operation of electrically connecting the channel layers of the first vertical memory string SST and C0 to C7 and the channel layers of the second vertical memory string C8 to C15 and DST included in the selected memory block 110MB when the memory block 110MB is selected.

In a memory block having a two-dimensional structure, one memory string may be connected to each bit line and the drain selected transistors of the memory block may be simultaneously controlled by one drain select line. However, in the memory block 110MB having the three-dimensional structure, the plurality of memory strings ST may be commonly connected to each of the bit lines BL. In the same memory block 110MB, the plurality of memory strings ST may be commonly connected to one bit line BL, and the number of memory strings ST controlled by the same word lines may be varied according to a design.

Since the plurality of memory strings ST are connected to one bit line BL in parallel, the drain select transistors DST may be independently controlled by select voltages applied to the drain select lines DSL1 to DSL4 to connect the one bit line BL and the memory strings ST selectively.

The memory cells C0 to C7 of the first vertical memory string SST and the memory cells C8 to C15 of the second vertical memory string C8 to C15 and DST vertically connected in the memory block 110MB may be controlled by operating voltages applied to the stacked word lines WL0 to WL7 and the stacked word lines WL8 to WL15, respectively. The word lines WL0 to WL15 may be divided in units of memory blocks.

The select lines DSL1 to DSL4, SSL1 to SSL4 and the word lines WL0 to WL15 may be local lines of the memory block 110MB. Particularly, the source select lines SSL1 to SSL4 and the word lines WL0 to WL7 may be local lines of the first vertical memory string. The drain select lines DSL1 to DSL4 and the word lines WL8 to WL15 may be local lines of the second vertical memory string. The gates PG of the pipe transistors PT may be commonly connected in the memory block 110MB.

For example, the memory cells connected to different bit lines and share the drain select line (for example, DSL4) in the memory block 110MB may configure one page. The memory block 110MB may be a basic unit of an erase loop, and the page may be a basic unit of a program loop and a read operation.

Referring to FIGS. 1 and 2B, the operation circuit 120 to 140 may be configured to perform the program loop, the erase loop, and the read operation. The program loop may include a program operation and a program verifying operation. The erase loop may include an erase operation and an erase verifying operation. The operation circuit 120 to 140 may perform the program operation (or a post-program operation) of controlling an erase level in which the threshold voltages of the memory cells are distributed after the erase loop.

In order to perform the program loop, the erase loop, and the read operation, the operation circuit 120 to 140 may be configured to selectively output the operating voltages to the local lines SSL, WL0 to WLn, PG, and DSL of the selected memory block and the common source line SL. In order to perform the program loop, the erase loop, and the read operation, the operation circuit 120 to 140 may be configured to control a precharge/discharge operation of the bit lines BL or to sense current flows (or voltage changes) of the bit lines BL.

When the semiconductor device is a NAND flash memory device, the operation circuit may include a control circuit 120, a voltage supply circuit 130, and a read/write circuit 140. Each component will be described below.

The control circuit 120 may generate operating voltages Verase, Vpgm, Vread, Vverify, Vpass, Vdsl, Vssl, Vcsl, and Vpg having target levels for performing the program loop, the erase loop, and the read operation in response to a command signal CMD input from outside the semiconductor device. The control circuit 120 may control the voltage supply circuit 130 so that the generated operating voltages are applied to the local lines SSL, WL0 to WLn, PG, and DSL and the common source line SL of the selected memory block. For example, the control circuit 120 may output a voltage control signal CMDv and a row address signal RADD to the voltage supply circuit 130. The control circuit 120 may control the precharge/discharge operation of the bit lines BL according to data for storing in the memory cells for performing the program loop, the erase loop, and the read operation. The control circuit 120 may control the read/write circuit 140 to sense the current flows (or the voltage changes) of the bit lines BL in the read operation or the program and erase verifying operations. For example, the control circuit 120 may output an operation control signal CMDpb to the read/write circuit 140.

The voltage supply circuit 130 may generate the operating voltages Verase, Vpgm, Vread, Vverify, Vpass, Vdsl, Vssl, Vcsl, and Vpg required according to the program loop, the erase loop, and the read operation of the memory cells according to the control signal CMDv of the control circuit 120. The operating voltages may include an erase voltage Verase, a program voltage Vpgm, a read voltage Vread, a verifying voltage Vverify, a pass voltage Vpass, select voltages Vdsl and Vssl, a common source voltage Vcsl, a pipe gate voltage Vpg, etc. The operating voltages may be output to the local lines SSL, WL0 to WLn, PG, and DSL and the common source line SL of the selected memory block in response to the row address signal RADD of the control circuit 120.

The read/write circuit 140 may include a plurality of page buffers (not illustrated) connected to the memory array 110 through the bit lines BL. Particularly, the page buffers may be connected to the bit lines BL, respectively. For example, one page buffer may be connected to one bit line BL. The page buffers may selectively precharge the bit lines BL according to the control signal CMDpb of the control circuit 120 and data DATA for storing in the memory cells during the program operation. The page buffers may latch data read from the memory cells by sensing the voltage changes or the current flows of the bit lines BL after precharging the bit lines BL according to the control signal CMDpb of the control circuit 120 in the program verifying operation or the read operation.

The operation circuits 120 to 140 described above may be configured to apply a level lower than the verifying voltage Vverify initially applied to the drain select transistors for the program verifying operation, the level being lower than a normal level. Also, the operation circuits 120 to 140 described above may be configured to increase the verifying voltage Vverify to the normal level whenever the program verifying operation is repeatedly performed.

The operation circuit 120 to 140 may increase the program voltage Vpgm applied to the drain select transistors by a first step voltage whenever the program operation is repeatedly performed, and may increase the verifying voltage Vverify by a second step voltage whenever the program verifying operation is repeatedly performed. It may be desired that the first step voltage of the program voltage Vpgm is greater than the second step voltage of the verifying voltage Vverify, and the second step voltage of the verifying voltage Vverify may be increased whenever the program verifying operation is repeatedly performed.

The operation circuit 120 to 140 may increase the verifying voltage Vverify after the program voltage Vpgm is greater than a reference voltage, increase the verifying voltage Vverify after the number of times the program operation is performed is greater than the number of reference times, or increase the verifying voltage Vverify after the number of the drain select transistors in which the threshold voltage is increased to the target level is greater than the number of reference times.

Figure 4:
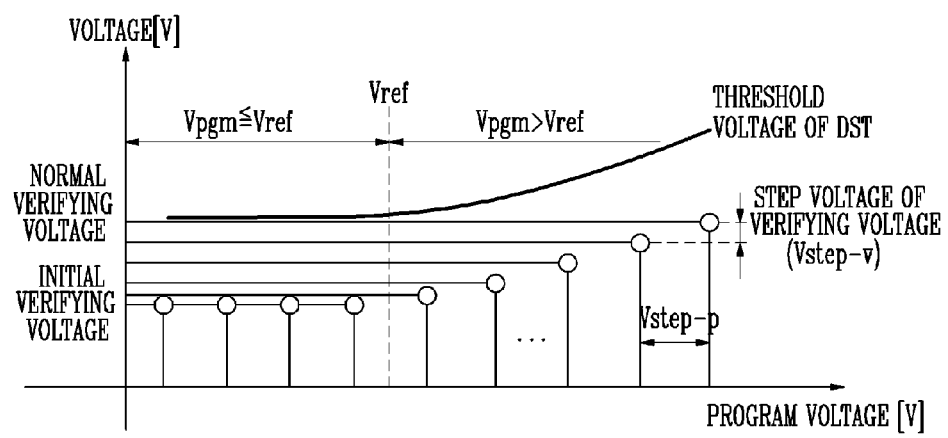
FIG. 4 is a representation of an example of a diagram for describing an operation of a semiconductor device according to an embodiment.

Hereinafter, a method of operating the semiconductor device including the memory blocks and the operation circuits described above will be described. FIG. 3 is a representation of an example of a flowchart for describing an operation of a semiconductor device according to an embodiment. FIG. 4 is a representation of an example of a diagram for describing an operation of a semiconductor device according to an embodiment.

Referring to FIGS. 1, 2C, and 3, in operation S310 (i.e., perform program operation on DST), the operation circuit 120 to 140 may perform the program operation on the drain select transistors DST included in the selected memory block 110MB. When all of the drain select transistors DST are in an erase state or all of the threshold voltages of the drain select transistors DST are less than the target level, the operation circuit 120 to 140 may apply a program allowance voltage (for example, 0 V) to the bit lines BL. The operation circuit 120 to 140 may apply the program voltage Vpgm to the drain select lines DSL1 to DSL4, and apply the pass voltage Vpass to remaining lines WL0 to WL15 and SSL1 to SSL4.

In the memory block 110MB, the plurality of memory strings ST may be connected to the bit line BL. For example, in the memory block 110MB, the plurality of drain select transistors DST may be connected to one bit line BL, and for example, four drain select transistors DST may be connected in parallel. The drain select lines DSL1 to DSL4 corresponding to the gates of the drain select transistors DST may be separated from each other.

When all of the drain select transistors DST included in the memory block 110MB are simultaneously programmed or substantially simultaneously programmed, the operation circuit 120 to 140 may simultaneously apply or substantially simultaneously apply the program voltage Vpgm to the drain select lines DSL1 to DSL4. After the program loop of the drain select transistors DST connected to the first drain select line DSL1 is completed, the program loop of the drain select transistors DST connected to the remaining drain select lines DSL2 to DSL4 may be sequentially performed.

In operation S320 (i.e., has the program operation succeeded?), it may be confirmed whether the program operation on the drain select transistors DST succeeded. For example, the operation circuit 120 to 140 may perform the program verifying operation on the drain select transistors DST. For example, the operation circuit 120 to 140 may precharge the bit lines BL, and apply the verifying voltage Vverify to the drain select lines DSL1 to DSL4, and apply the pass voltage Vpass to the remaining lines WL0 to WL15 and SSL1 to SSL4. It may be desired that the operation circuit 120 to 140 apply the verifying voltage Vverify less than the normal level in an initial program verifying operation.

Next, the operation circuit 120 to 140 may sense the voltage or current changes of the bit lines BL, and latch the sensing result. The operation circuit 120 to 140 may determine whether the program operation has succeeded according to the latched sensing result. For example, the operation circuit 120 to 140 may confirm that the threshold voltages of all of the drain select transistors DST increase to the target level using the latched sensing result.

When the threshold voltages of all of the drain select transistors DST increase to the target level, the program operation may be completed (i.e. End).

When the program operation has not succeeded (i.e., No) since the drain select transistor DST in which the threshold voltage is less than the target level is detected, the program voltage Vpgm may be changed in operation S330 (i.e., change program voltage). For example, as illustrated in FIG. 4, the operation circuit 120 to 140 may increase the program voltage Vpgm by the first step voltage Vstep-p. In operation S340 (Vpgm>Vref?), the operation circuit 120 to 140 may confirm whether the program voltage Vpgm is greater than the reference voltage Vref.

In the operation S340, when it is confirmed that the program voltage Vpgm is equal to or less than the reference voltage Vref (i.e., No), the operation circuit 120 to 140 may perform the program operation on the drain select transistors DST again in the operation S310 using the changed program voltage Vpgm. At this time, a program prohibition voltage (for example, Vcc) may be applied to the bit line BL of the drain select transistor in which the threshold voltage is increased to the target level. Next, the operations S320 to S340 may be performed again.

In the operation S340, when it is confirmed that the program voltage Vpgm is greater than the reference voltage Vref (i.e., Yes), the operation circuit 120 to 140 may perform the program operation on the drain select transistors DST again in operation S350 (i.e., perform program operation on DST) using the changed program voltage Vpgm. At this time, the program prohibition voltage (for example, Vcc) may be applied to the bit line BL of the drain select transistor in which the threshold voltage is increased to the target level.

Next, in operation S360 (i.e., change program verifying voltage), the verifying voltage Vverify may be changed. As an example, the operation circuit 120 to 140 may increase the verifying voltage Vverify by the second step voltage Vstep-v as illustrated in FIG. 4. At this time, it may be desired that the first step voltage Vstep_p of the program voltage Vpgm is greater than the second step voltage Vstep_v of the verifying voltage Vverify.

In operation S370 (i.e., has the program operation succeeded?), the operation circuit 120 to 140 may confirm whether the program operation on the drain select transistors DST has succeeded. For this operation S370, the operation circuit 120 to 140 may perform the program verifying operation on the drain select transistors DST. The program verifying operation may be performed by the same method as the program verifying operation described above in the operation S320.

When the program operation has not succeeded since the drain select transistor DST in which the threshold voltage is less than the target level is detected, the program voltage Vpgm may be changed in operation S380 (i.e., change program voltage). That is, as illustrated in FIG. 4, the operation circuit 120 to 140 may increase the program voltage Vpgm by the first step voltage Vstep-p.

Next, in the operation S350, the operation circuit 120 to 140 may perform the program operation on the drain select transistors DST again using the changed program voltage Vpgm. At this time, the program prohibition voltage (for example, Vcc) may be applied to the bit line BL of the drain select transistor in which the threshold voltage is increased to the target level.

In the operation S360, the operation circuit 120 to 140 may further increase the verifying voltage Vverify by the second step voltage Vstep_v. At this time, the second step voltage Vstep_v may be increased whenever the program verifying operation in the operation S370 is repeatedly performed. That is, the operation circuit 120 to 140 may increase an increase rate of the verifying voltage Vverify whenever the program verifying operation is repeatedly performed.

In the operation S370, when it is confirmed that the threshold voltages of all of the drain select transistors DST are increased to the target level, the program loop of the drain select transistors DST may be completed (i.e., Yes and End).

Referring to FIG. 4, in the program operation and the program verifying operation on the drain select transistor, only the program voltage Vpgm may be increased by the first step voltage Vstep_p and the verifying voltage Vverify which is smaller than the normal level may be applied whenever the program operation and the program verifying operation are repeatedly performed in a period in which the program voltage Vpgm is equal to or smaller than the reference voltage Vref. The program voltage Vpgm may be increased by the first step voltage Vstep-p and the verifying voltage Vverify may be increased by the second step voltage Vstep-v whenever the program operation and the program verifying operation are repeatedly performed in a period in which the program voltage Vpgm is greater than the reference voltage Vref. Finally, the verifying voltage Vverify may be increased to the normal level.

As described above, when the program operation and the program verifying operation on the drain select transistors are repeatedly performed while increasing the verifying voltage Vverify from a lower level to the normal level, the drain select transistor in which the threshold voltage is abnormally greater than the target level may not be generated, and the threshold voltage distribution of the drain select transistors may be narrowly controlled. As a result, reliability of the operation may be improved.

Figure 5:
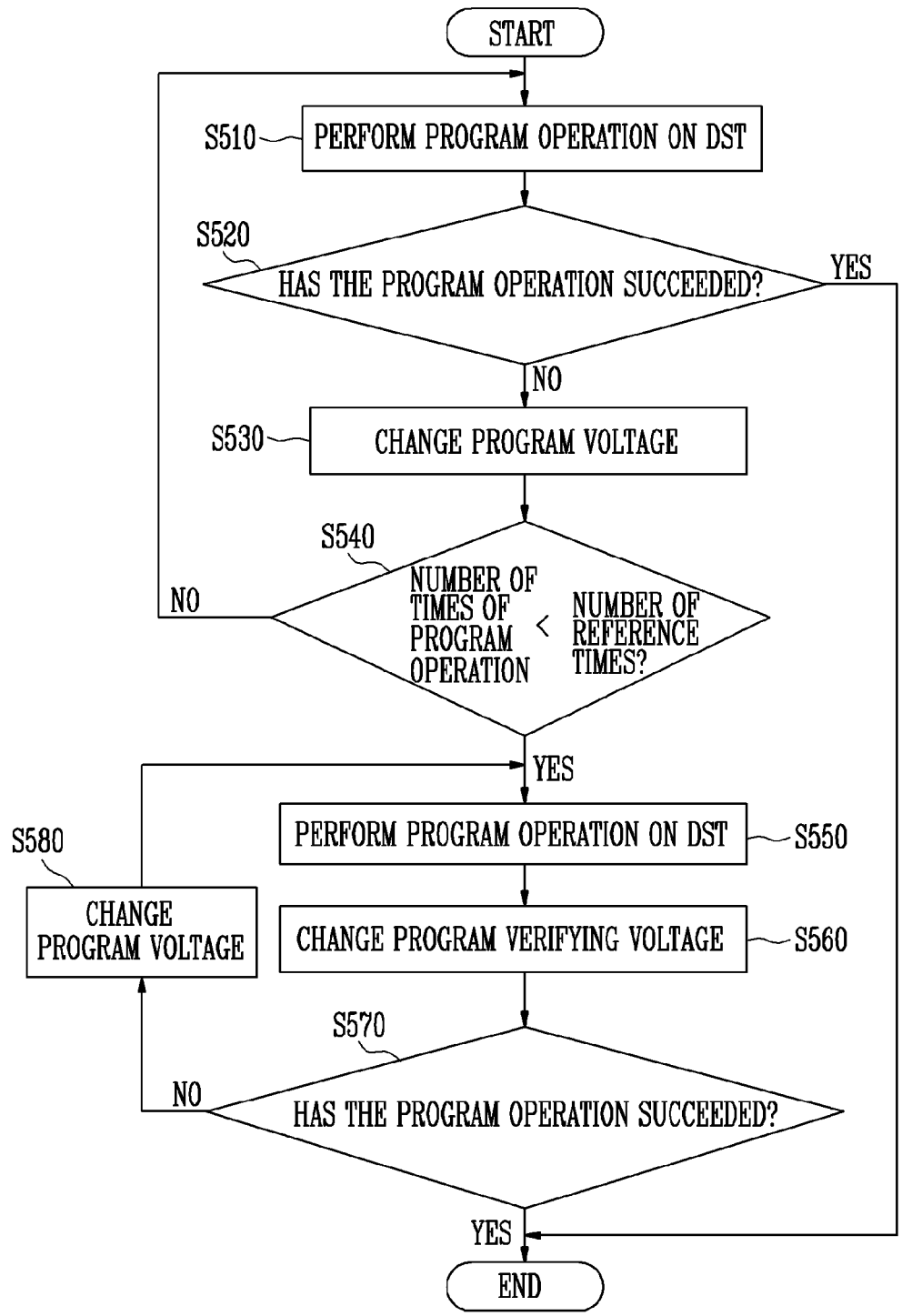
FIGS. 5 and 6 are representations of examples of flowcharts for describing an operation of a semiconductor device according to an embodiment.
Figure 6:
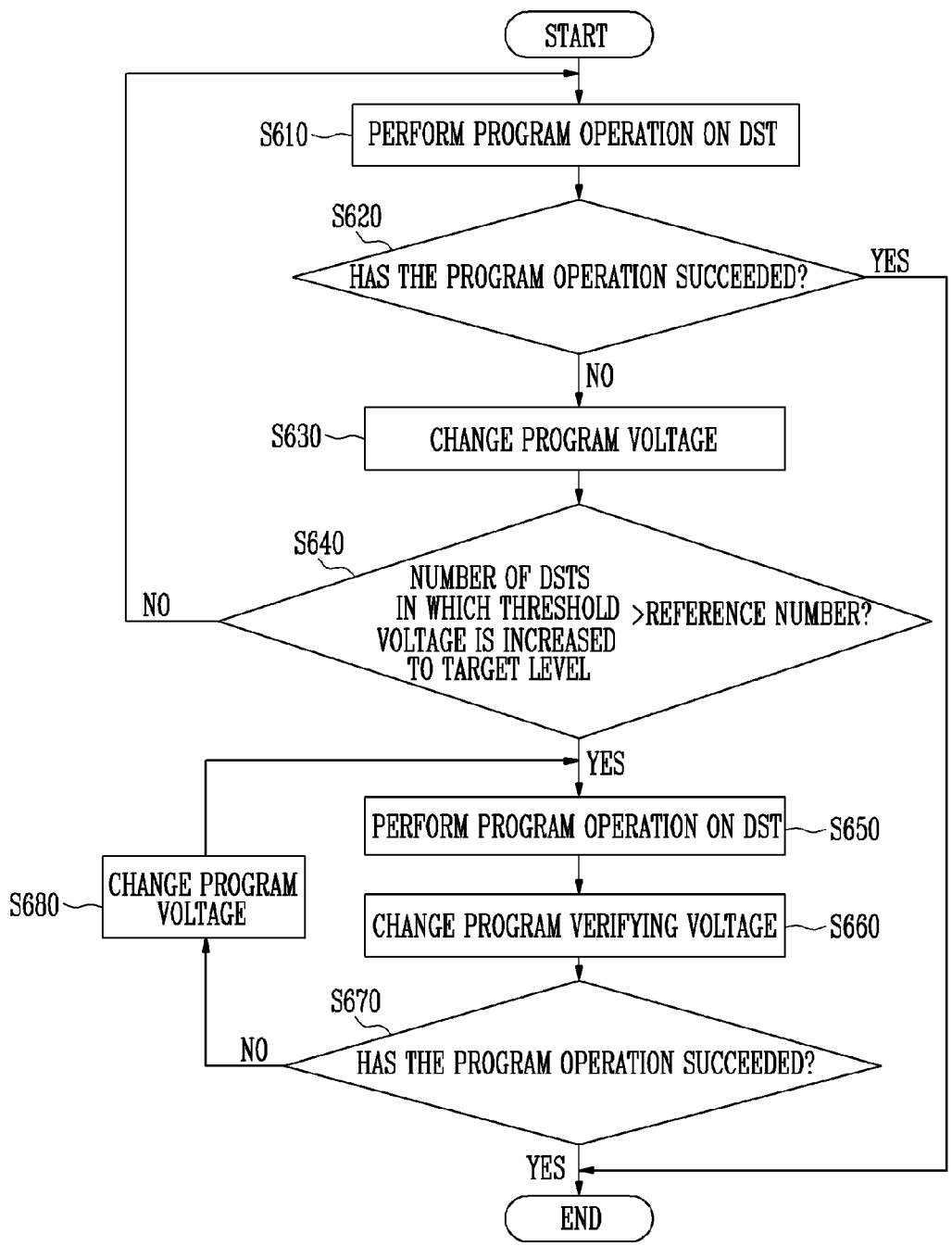

As described above, when the program voltage is greater than the reference voltage, the verifying voltage is increased, but a time in which the verifying voltage is increased may be determined based on another standard. This will be described below. FIGS. 5 and 6 are representations of examples of flowcharts for describing an operation of a semiconductor device according to an embodiment.

Referring to FIGS. 1, 2C, and 5, operations S510 to S530 may be performed by the same method as the operations S310 to S330.

The operation circuit 120 to 140 may increase the verifying voltage Vverify after the number of times in which the program operation of the operation S510 is performed is greater than the number of reference times. For example, in operation S540 (i.e., number of times of program operation<number of reference time?), whenever the program operation of the operation S510 is performed, the operation circuit 120 to 140 may count the number of times, and compare the number of times in which the program operation of the operation S510 has performed and the number of reference times.

In the operation S540, when the number of times the program operation has performed is equal to or less than the number of reference times, the operations S510 to S530 may be performed again by the same method as the operations S310 to s380 of FIG. 3.

Referring to FIGS. 1, 2C, and 6, operations S610 to S630 may be performed by the same method as the operations S310 to S330 of FIG. 3.

The operation circuit 120 to 140 may increase the verifying voltage Vverify after the number of the drain select transistors DST in which the threshold voltage is increased to the target level is greater than a reference number. For example, in operation S640 (i.e., number of DSTS in which threshold voltage is increased to target level>reference number?), the operation circuit 120 to 140 may determine the number of the drain select transistors DST in which the threshold voltage is increased to the target level using the sensing result latched in the operation S620. Then in operation S640 the operation circuit 120-140 may compare the determined number of the drain select transistors DST and the reference number.

In the operation S640, when the number of the drain select transistors in which the program operation has succeeded is equal to or less than the reference number, the operations S610 to S630 may be performed again by the same method as the operations S310 to S330 of FIG. 3. In the operation S640, when it is confirmed that the number of the drain select transistors in which the program operation has succeeded is greater than the reference number, operations S650 to S680 may be performed by the same method as the operations S350 to S380 of FIG. 3.

Even when a time of increasing the verifying voltage is determined based on another standard, the threshold voltage distribution of the drain select transistors may be narrowly controlled, and the reliability of the operation may be improved.

Figure 7:
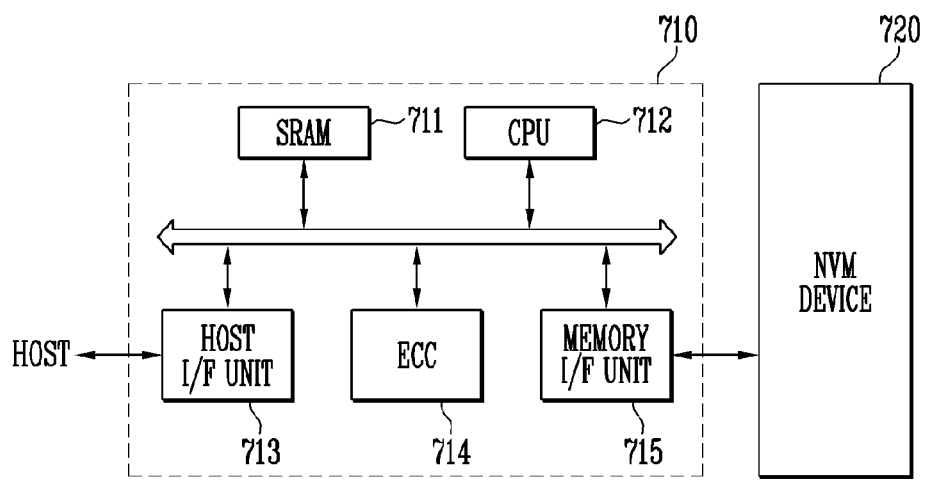
FIG. 7 is a schematic block diagram illustrating a representation of an example of a memory system according to an embodiment.

FIG. 7 is a schematic block diagram illustrating a representation of an example of a memory system according to an embodiment.

Referring to FIG. 7, a memory system 700 according to an embodiment may include a non-volatile memory (NVM) device 720, and a memory controller 710.

The NVM device 720 may correspond to the semiconductor devices and/or embodiments described above with reference to FIGS. 1 to 6. The memory controller 710 may be configured to control the NVM device 720. The memory system 700 may be provided as a memory card or a solid state disk (SSD) by combining the NVM device 720 and the memory controller 710. An SRAM 711 may be used as an operating memory of a central processing unit (CPU) 712. A host interface (I/F) unit 713 may include a data exchange protocol of a host connected to the memory system 700. An error correction circuit (ECC) 714 may detect and correct an error included in data read from a cell region of the NVM device 720. A memory interface (I/F) unit 715 may perform an interface with the NVM device 720 according to an embodiment. Further, the CPU 712 may perform various control operations for data exchange of the memory controller 710.

Although not illustrated, it may be apparent to those of ordinary skill in the art that the memory system 700 according to an embodiment may further include a read only memory (ROM) (not illustrated) for storing code data for an interface with the host. The NVM device 720 may be a multi-chip package in which a plurality of flash memory chips are included. The memory system 700 according to an embodiment may be provided as a high reliability storage medium in which operating characteristics are improved. Particularly, the flash memory device of the various embodiments may be included in the memory system such as the SSD. In these embodiments, the memory controller 710 may communicate with the outside (for example, the host) through at least one among various protocols such as a Universal Serial Bus (USB) protocol, a MultiMediaCard (MMC) protocol, a Peripheral Component Interconnect (PCI)-Express (PCI-E) protocol, a Serial Advanced Technology Attachment (SATA) protocol, a Parallel ATA (PATA) protocol, a Small Computer System Interface (SCSI) protocol, an Enhanced Small Disk Interface (ESDI) protocol, an Integrated Drive Electronics (IDE) protocol, etc.

Figure 8:
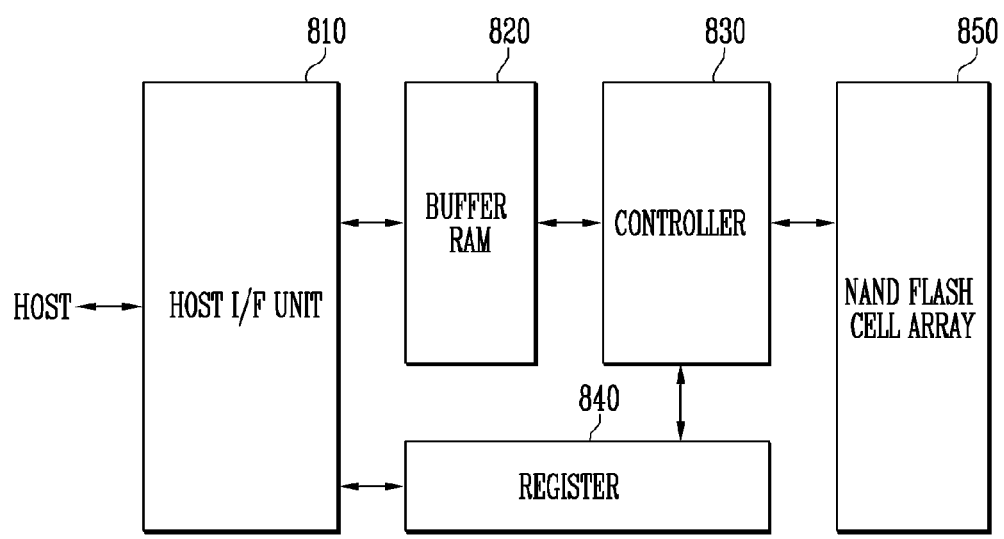
FIG. 8 is a schematic block diagram illustrating a representation of an example of a fusion memory device or a fusion memory system performing a program operation according to various embodiments described above.

FIG. 8 is a schematic block diagram illustrating a representation of an example of a fusion memory device or a fusion memory system performing a program operation. Technical features of the embodiments described above with reference to FIGS. 1 to 7 may be applied to one NAND flash memory device 800. The flash memory device 800 may be a fusion memory device.

The one NAND flash memory device 800 may include a host interface (I/F) unit 810 for exchanging various kinds of information with a device using a different protocol, a buffer RAM 820 for embedding codes for driving the semiconductor device or temporarily storing data, a controller 830 for controlling read and program operations and every state in response to a control signal and a command input from the outside, a register 840 for storing data such as configuration, etc. defining a system operating environment inside the memory device, and a NAND flash cell array 850 configured as an operation circuit including a non-volatile memory cell and a page buffer. The one NAND flash memory device may program data according to a conventional method in response to a write request from the host.

Figure 9:
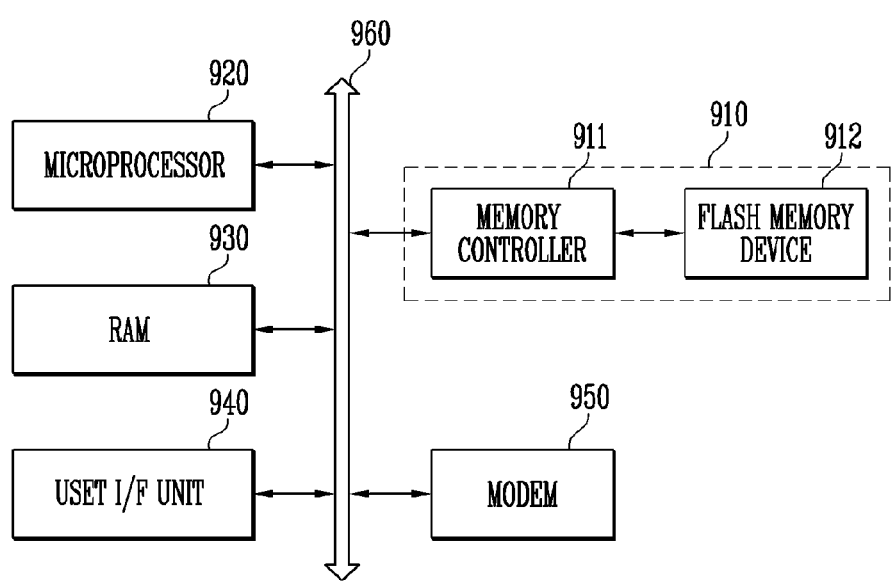
FIG. 9 is a schematic block diagram illustrating a representation of an example of a computing system including a flash memory device according to an embodiment.

FIG. 9 is a schematic block diagram illustrating a representation of an example of a computing system including a flash memory device 912 according to an embodiment.

Referring to FIG. 9, a computing system 900 according to an embodiment may include a microprocessor 920, a RAM 930, a user interface (I/F) unit 940, a modem 950 such as a baseband chipset, and a memory system 910, which are electrically connected to a system bus 960. When the computing system 900 is a mobile device, a battery (not illustrated) for supplying an operating voltage to the computing system 900 may be further included. Although not illustrated, it may be apparent to those of ordinary skill in the art that an application chipset, a camera image processor (CIS), and a mobile DRAM, etc. may be further included in the computing system 900 according to an embodiment. For example, the SSD using the non-volatile memory devices and/or embodiments described above with reference to FIGS. 1 to 8 may be configured in the memory system 910 in order to store data. Further, the memory system 910 may be provided as the fusion flash memory (for example, the one NAND flash memory).

The semiconductor device according to an embodiment may improve the reliability of the operation.

The technical spirit of the embodiments described above has been described with reference to various examples of embodiments, but it should be noted that the embodiments are used for the description and are not for purposes of limitation. Therefore, it will be understood by those of ordinary skill in the art that various changes in form and details may be made therein without departing from the spirit and scope of the application.

What is claimed is:

1. A semiconductor device, comprising:
   a memory block including drain select transistors connected to bit lines, source select transistors connected to a common source line, and memory cells connected between the drain select transistors and the source select transistors; and
   an operation circuit configured to repeatedly perform a program operation and a program verifying operation to increase threshold voltages of the drain select transistors to a target level,
   wherein the operation circuit is configured to apply a level lower than a verifying voltage initially applied to the drain select transistors for the program verifying operation, the level being lower than a normal level, and configured to increase the verifying voltage to the normal level whenever the program verifying operation is repeated.

2. The semiconductor device of claim 1, wherein the operation circuit is configured to increase a program voltage applied to the drain select transistors by a first step voltage whenever the program operation is repeated.

3. The semiconductor device of claim 2, wherein the operation circuit is configured to increase the verifying voltage after the program voltage is greater than a reference voltage.

4. The semiconductor device of claim 2, wherein the operation circuit is configured to increase the verifying voltage by a second step voltage whenever the program verifying operation is repeated.

5. The semiconductor device of claim 4, wherein the second step voltage is increased whenever the program verifying operation is repeated.

6. The semiconductor device of claim 4, wherein the first step voltage is greater than the second step voltage.

7. The semiconductor device of claim 1, wherein the operation circuit is configured to increase the verifying voltage after the program operation is performed more times than the number of reference times.

8. The semiconductor device of claim 7, wherein the operation circuit is configured to increase the verifying voltage by a second step voltage whenever the program verifying operation is repeated.

9. The semiconductor device of claim 8, wherein the operation circuit is configured to increase a program voltage applied to the drain select transistors by a first step voltage whenever the program operation is repeated.

10. The semiconductor device of claim 9, wherein the first step voltage is greater than the second step voltage.

11. The semiconductor device of claim 8, wherein the second step voltage is increased whenever the program verifying operation is repeated.

12. The semiconductor device of claim 1, wherein the operation circuit is configured to increase the verifying voltage after the number of the drain select transistors in which the threshold voltage is increased to the target level is greater than a reference number.

13. The semiconductor device of claim 12, wherein the operation circuit is configured to increase the verifying voltage by a second step voltage whenever the program verifying operation is repeated.

14. The semiconductor device of claim 13, wherein the operation circuit is configured to increase a program voltage applied to the drain select transistors by a first step voltage whenever the program operation is repeated.

15. The semiconductor device of claim 14, wherein the first step voltage is greater than the second step voltage.

16. The semiconductor device of claim 13, wherein the second step voltage is increased whenever the program verifying operation is repeated.

17. The semiconductor device of claim 1, wherein the memory block is formed over a substrate and further includes pipe transistors, and
   a portion of the memory cells are connected between the pipe transistor and the drain select transistor, and remaining memory cells are connected between the pipe transistor and the source select transistor.

18. A method of operating a semiconductor device including an operation circuit and a memory block, the memory block including drain select transistors connected to bit lines, source select transistors connected to a common source line, and memory cells connected between the drain select transistors and the source select transistors, the method comprising:

repeatedly performing a program operation and a program verifying operation to increase threshold voltages of the drain select transistors to a target level;

applying a level lower than a verifying voltage initially applied to the drain select transistors for the program verifying operation, the level being lower than a normal level; and increasing the verifying voltage to the normal level whenever the program verifying operation is repeated.

19. The method of operating the semiconductor device according to claim 18, further comprising:

increasing a program voltage applied to the drain select transistors by a first step voltage whenever the program operation is repeated.

20. The method of operating the semiconductor device according to claim 19, further comprising:

increasing the verifying voltage after the program voltage is greater than a reference voltage.

* * * * *